(12) United States Patent
Kawano

(10) Patent No.: US 9,812,620 B2
(45) Date of Patent: Nov. 7, 2017

(54) LIGHT EMITTING DEVICE AND METHOD OF MANUFACTURING THE LIGHT EMITTING DEVICE

(71) Applicant: NICHIA CORPORATION, Anan-shi, Tokushima (JP)

(72) Inventor: Yusuke Kawano, Anan (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 15/336,115

(22) Filed: Oct. 27, 2016

(65) Prior Publication Data

US 2017/0125653 A1 May 4, 2017

(30) Foreign Application Priority Data

Oct. 30, 2015 (JP) .................................. 2015-215254
Jul. 26, 2016 (JP) .................................. 2016-146599
Aug. 31, 2016 (JP) .................................. 2016-169836

(51) Int. Cl.
| | |
|---|---|
| H01L 33/00 | (2010.01) |
| H01L 21/00 | (2006.01) |
| H01L 33/58 | (2010.01) |
| H01L 27/15 | (2006.01) |
| H01L 33/54 | (2010.01) |
| H01L 33/50 | (2010.01) |

(52) U.S. Cl.
CPC ............ H01L 33/58 (2013.01); H01L 27/156 (2013.01); H01L 33/504 (2013.01); H01L 33/507 (2013.01); H01L 33/54 (2013.01); H01L 2933/005 (2013.01)

(58) Field of Classification Search
CPC ....... H01L 33/58; H01L 33/54; H01L 33/504; H01L 33/507; H01L 27/156
USPC ..................................... 257/89, 98; 438/27
See application file for complete search history.

(56) References Cited

U.S. PATENT DOCUMENTS

| | | | | |
|---|---|---|---|---|
| 2016/0020369 A1* | 1/2016 | Ukawa | ................... | H01L 33/507 362/311.01 |
| 2017/0069805 A1* | 3/2017 | Nagahama | ............ | H01L 27/156 |
| 2017/0077362 A1* | 3/2017 | Ogata | ................... | H01L 33/507 |
| 2017/0077369 A1* | 3/2017 | Nagahama | .............. | H01L 33/62 |

FOREIGN PATENT DOCUMENTS

| | | |
|---|---|---|
| JP | 2012-004519 A | 1/2012 |
| JP | 2013-051375 A | 3/2013 |
| JP | 2013-229492 A | 11/2013 |

(Continued)

*Primary Examiner* — David S Blum
(74) *Attorney, Agent, or Firm* — Foley & Lardner LLP

(57) ABSTRACT

A light emitting device includes a substrate; a first frame located on the substrate; a second frame located on the substrate, the second frame being located inward of and spaced apart from the first frame; at least one first light emitting element located on the substrate in a first region located between the first frame and the second frame; at least one second light emitting element located on the substrate in a second region located inward of the second frame; and a sealing member covering the at least one first light emitting element and the at least one second light emitting element. The second frame includes a light-transmissive portion. A highest portion of the second frame is higher than a highest portion of the first frame.

17 Claims, 7 Drawing Sheets

(56) References Cited

FOREIGN PATENT DOCUMENTS

| | | |
|---|---|---|
| JP | 2014-036063 A | 2/2014 |
| JP | 2014-138185 A | 7/2014 |
| JP | 2014-229759 A | 12/2014 |
| JP | 2015-095488 A | 5/2015 |
| WO | WO-2013/015058 A1 | 1/2013 |

\* cited by examiner

LIGHT EMITTING DEVICE AND METHOD OF MANUFACTURING THE LIGHT EMITTING DEVICE

CROSS-REFERENCE TO RELATED PATENT APPLICATION

The present application claims priority to Japanese Patent Application Nos. 2015-215254 filed on Oct. 30, 2015, 2016-146599 filed on Jul. 26, 2016, and 2016-169836 filed on Aug. 31, 2016, the disclosures of all of which are hereby incorporated by reference in their entireties.

BACKGROUND

The present disclosure relates to a light emitting device and a method of manufacturing the light emitting device.

A light emitting device has been proposed that has a plurality of light emitting elements such as light emitting diodes LEDs arranged on a substrate, with an aim of obtaining illumination light of high luminance, or obtaining illumination light with good color rendering. For example, Japanese Unexamined Patent Application Publications No. 2014-36063 and No. 2014-229759, and PCT Publication No. WO 2013/015058 respectively disclose a light emitting device in which a frame surrounding a region having a plurality of light emitting elements and a frame demarcating the region having the plurality of light emitting elements into a plurality of regions. The demarcated regions are designated as light emitting regions to emit light of different colors, which is mixed to generate illumination light of a desired color. Also, Japanese Unexamined Patent Application Publication No. 2015-95488 discloses a lighting device in which a reflecting member is provided at an upper surface side of light emitting elements to extract light from lateral surfaces of each of the light emitting elements, and a light shielding component covered by a light-reflecting member is provided between the light emitting elements to reflect light from the lateral surfaces of the light emitting elements so as to decrease unevenness of light intensity in light emitted from an upper surface side of a light emitting device.

SUMMARY

An object of the certain embodiments of the present disclosure is to provide a light emitting device having a plurality of light emitting elements disposed on a substrate, in which color unevenness and/or luminance unevenness in the emitting light has been reduced, and to provide a method of manufacturing the light emitting device.

A light emitting device according to one embodiment of the present disclosure includes a substrate, a first frame on the substrate, a second frame on the substrate, located inward of and spaced apart from the first frame, at least one first light emitting element on a substrate in a first region located between the first frame and the second frame, at least one second light emitting element on the substrate in a second region located inward of the second frame, and a sealing member covering the at least one first light emitting element and the at least one second light emitting element. The second frame includes a light-transmissive portion, a highest portion of the second frame being higher than a highest portion of the first frame, an upper surface of the sealing member in the first region is formed such that a portion closer to the first frame is lower than a portion closer to the second frame, and an upper surface of the sealing member in the second region is formed higher than the lowest portion of the upper surface of the sealing member in the first region.

A method of manufacturing a light emitting device according to one embodiment of the present disclosure includes mounting at least one first light emitting element on a first portion of a substrate and at least one second light emitting element on a second portion of the substrate, forming a first frame on the substrate, surrounding the at least one first light emitting element and the at least one second light emitting element, forming a second frame on the substrate and between the at least one light emitting element and the at least one second light emitting element, surrounding the at least one second light emitting element, and disposing a sealing member in a first region surrounded between the first frame and the second frame and in a second region surrounded by the second region, covering the at least one light emitting element and the at least one second light emitting element.

The first frame and the second frame are formed spaced apart from each other and a highest portion of the second frame is formed higher than a highest portion of the first frame.

DETAILED DESCRIPTION

Figure 1A:
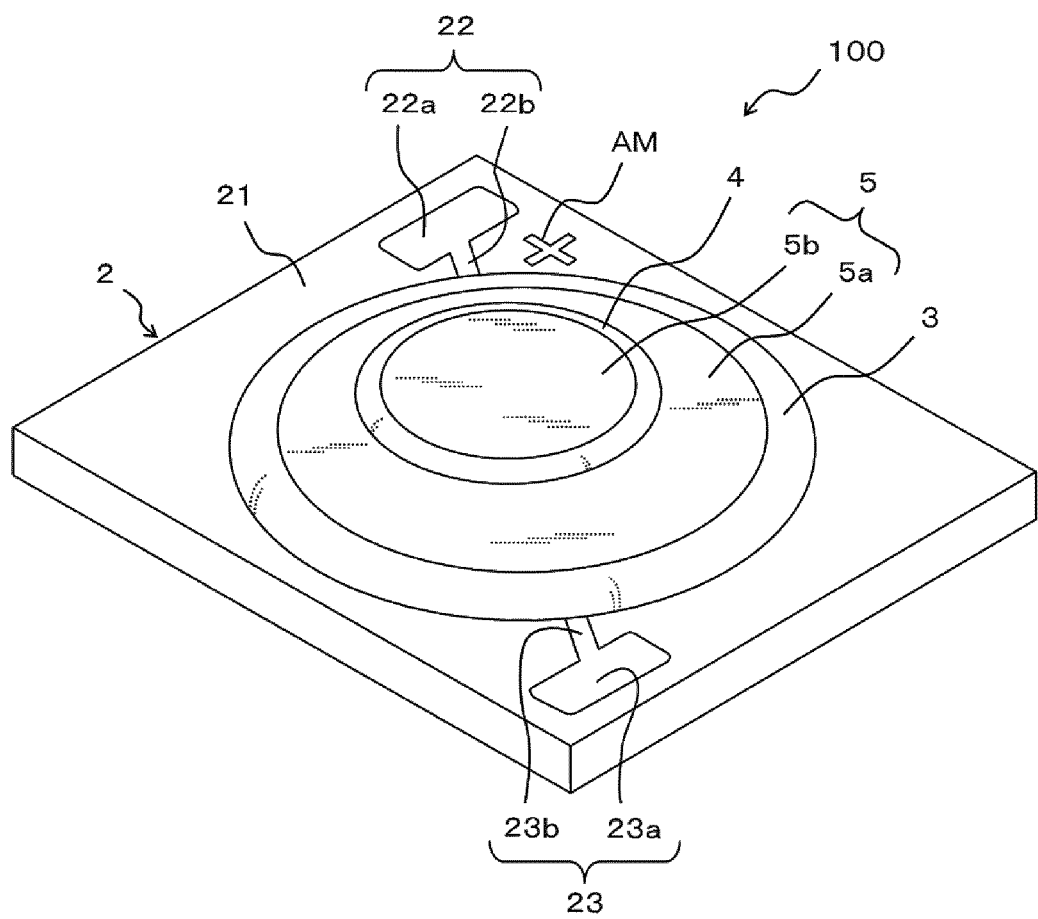
FIG. 1A is a schematic perspective view illustrating a configuration of a light emitting device according to a first embodiment.

Hereinafter, a method of manufacturing a light emitting device according to several embodiments will be described with reference to the drawings. The sizes, positional relationships and so on of members shown in the drawings may be exaggerated for clarification of explanation. Further, in the following descriptions, the same names and symbols generally show the same or equivalent members, and detailed descriptions thereof are appropriately omitted.

In order to further reduce unevenness in color or in luminance in the light emitting devices disclosed in Japanese Unexamined Patent Application Publications No. 2014-36063 and No. 2014-229759, and the lighting device disclosed in Japanese Unexamined Patent Application Publication No. 2015-95488 discussed above, it may be needed to provide an additional lens and/or an additional light diffusing plate that covers the entire light-emitting side of the light emitting region where the plurality of light emitting elements are arranged. The light emitting device disclosed in International Laid-open No. WO 2013/015058 discussed above has a lens-shaped transparent member at the light emitting surface side, but the light emitting region is radially demarcated, which leaves room for further improvement in color unevenness and/or luminance unevenness.

The light emitting device according to certain embodiments of the present disclosure can reduce color unevenness and/or luminance unevenness in the emitting light. The method of manufacturing a light emitting device according to certain embodiments of the present disclosure can allow for manufacture of a light emitting device in which color unevenness and/or luminance unevenness in the emitting light can be reduced.

Configuration of Light Emitting Device

A configuration of a light emitting device according to a first embodiment will be described with reference to FIG. 1A to FIG. 1C. For convenience of illustration, in the plan view shown in FIG. 1B, outlines of a first frame 3 and a second frame 4 are shown in dot-dashed lines and outlines of a first sealing member 5a and a second sealing member 5b are shown in dashed lines. Thus, those members are shown in see-through representation.

Figure 1B:
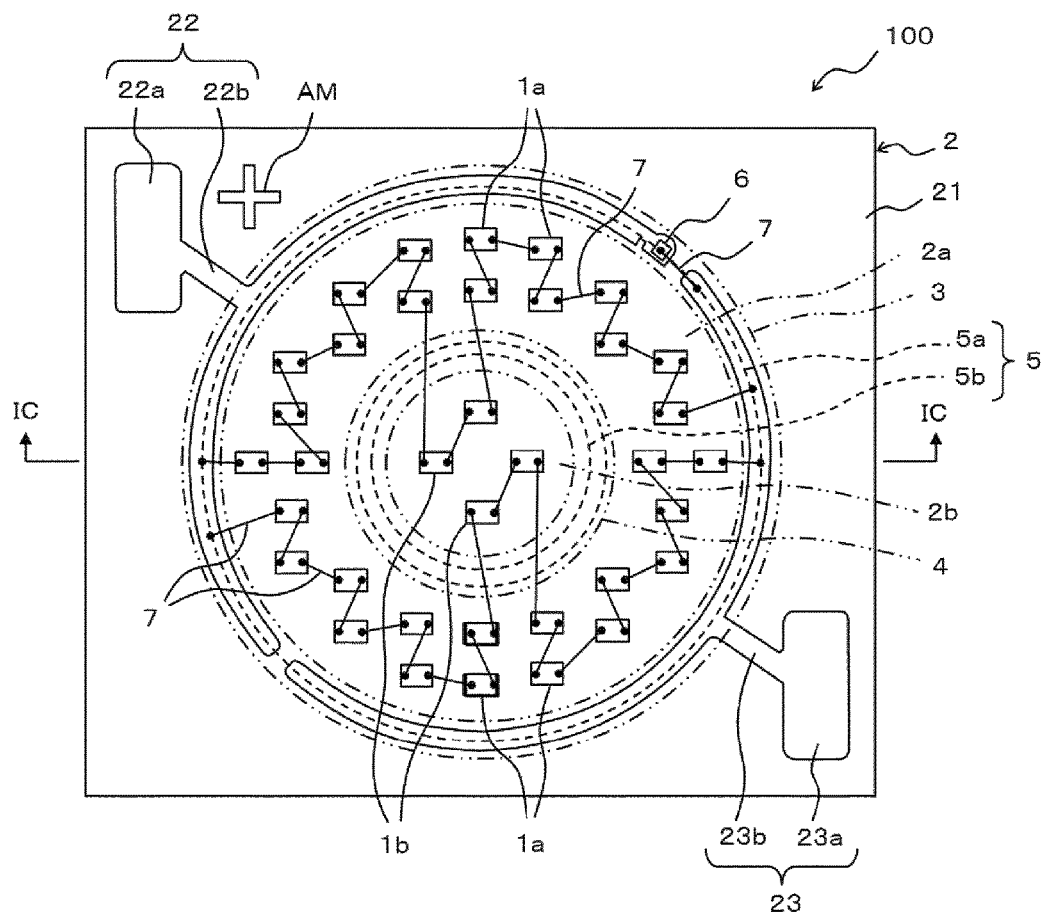
FIG. 1B is a schematic plan view illustrating a configuration of a light emitting device according to the first embodiment.

The light emitting device 100 according to the first embodiment is, as shown in FIG. 1B, a chip on board (COB) type light emitting device having a plurality of light emitting elements 1a, 1b on a flat plate-shaped mounting substrate 2.

The light emitting device 100 according to the first embodiment has, in a plan view, a substantially circular first frame 3 and a substantially circular second frame 4 are concentrically arranged on a substantially rectangular mounting substrate 2. A plurality of first light emitting elements 1a is arranged in a first region 2a between the first, outer frame 3 and a second, inner frame 4 that is formed inward of the first frame 3. A plurality of second light emitting elements 1b is arranged in a second region 2b that is a region inward of the second frame 4. Also, as shown in FIG. 1A and FIG. 1C, a sealing member 5 is disposed in the region inward of the first frame 3. In more detail, a first sealing member 5a is disposed in the first region 2a between the first frame 3 and the second frame 4, and the plurality of the first light emitting elements 1a is sealed. A second sealing member 5b is disposed in the second region 2b located inward of the second frame 4, and the plurality of second light emitting elements 1b is sealed.

In the first embodiment, the sealing member 5 has a convex-lens shape as an integrated shape of the first sealing member 5a and the sealing member 5b. The sealing member 5 is configured so that light emitted by the plurality of first light emitting elements 1a and light emitted by the plurality of second light emitting elements 1b, and light whose wavelength have been converted by a wavelength converting material (e.g., a fluorescent material) contained in the sealing member 5 are mixed well so that color unevenness and/or luminance unevenness in the emitting light can be reduced.

Each constituent member will be described in detail below.

First Light Emitting Element, Second Light Emitting Element

The first light emitting elements 1a and the second light emitting elements 1b are LED chips. In the figures, the first light emitting elements 1a and the second light emitting elements 1b have a same configuration, but the first light emitting elements 1a and the second light emitting elements 1b may have different configurations and/or may be configured to emit light of different colors.

In the first embodiment, a plurality of the first light emitting elements 1a are dispersedly arranged at substantially even intervals in the first region 2a of an upper surface of a mounting substrate 2. Also, a plurality of the second light emitting elements 1b are dispersedly arranged at substantially even intervals in the second region 2b of the upper surface of the mounting substrate 2. As described above, the light emitting elements are approximately evenly arranged on the upper surface of the mounting substrate, thus, luminance unevenness of the emitting light of the light emitting device can be reduced.

Figure 1C:
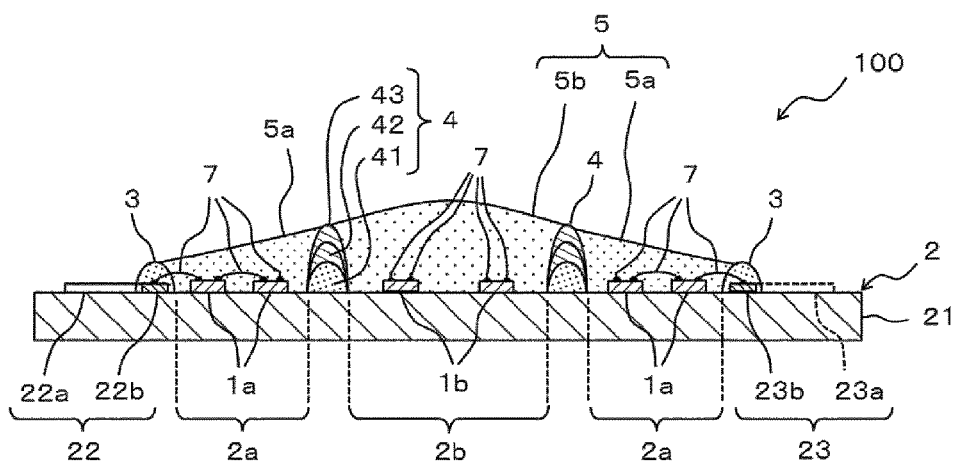
FIG. 1C is a schematic cross-sectional view illustrating a configuration of a light emitting device according to the first embodiment.

In the first embodiment, as shown in FIG. 1B and FIG. 1C, the first light emitting elements 1a and the second light emitting elements 1b are bonded on the mounting substrate 2 by bonding surfaces of the first light emitting elements 1a and second light emitting elements 1b, where electrodes are not arranged and the upper surface of the mounting substrate with a bonding member such as a die-bonding resin. In the first embodiment, the first light emitting elements 1a and the second light emitting elements 1b are arranged in two groups. Each group is in series connection via wires 7 between a first wiring 22 and a second wiring 23 of the mounting substrate 2. At this time, the number of the first light emitting elements 1a and the number of the second light emitting elements 1b in the two groups in series connection are preferably the same. With this arrangement, substantially the same amount of electric current can be supplied to each of the first light emitting elements 1a and each of the second light emitting elements 1b, so that uneven distribution of emission intensity among the chips can be reduced.

As for the numbers, at least one first light emitting element 1a and at least one second light emitting element 1b may be employed. An arrangement interval of the first light emitting elements 1a and the second light emitting elements 1b may be uneven, or at desired intervals. Further, the first light emitting elements 1a and the second light emitting elements 1b may be mounted on the mounting substrate 2 in a flip-chip manner according to the wiring patterns. The first light emitting elements 1a and the second light emitting elements 1b are electrically connected by appropriate connection, for example, one group of or three or more separate groups of the first light emitting elements 1a and the second light emitting elements 1b may be connected in series, in parallel, or a combination of parallel connection and series connection.

The first light emitting elements 1a are sealed by the first sealing member 5a, and in the case where a wavelength converting material (fluorescent material) is contained in the first sealing member 5a, the wavelength of a portion or the entire of the emitted light by the first light emitting elements 1a is converted by the wavelength converting material (fluorescent material). The second light emitting elements 1b are sealed by the second sealing member 5b. In the case where a wavelength converting material (fluorescent material) is contained in the second sealing member 5b, the wavelength of a portion or entire of the emitted light by the second light emitting elements 1b is converted by the wavelength converting material (fluorescent material).

A portion of light propagating in the first sealing member 5a passes through the light-transmissive portion of the second frame 4 and propagates in the second region, and a portion of light propagating in the second sealing member 5b passes through the light-transmissive portion of the second frame 4 and propagate in the first region, and the lights are mixed.

Thus, light originating from the first light emitting elements 1a and light originating from the second light emitting elements 1b are mixed in the sealing member 5 and extracted to the outside from the upper surface of the sealing member 5.

The light originating from the first light emitting elements 1a includes light emitted by the first light emitting elements 1a and wavelength-converted light that is emitted by the first light emitting elements 1a and wavelength-converted by the wavelength converting material contained in the first sealing member 5a. The light originating from the second light emitting elements 1b includes light emitted by the second light emitting elements 1b and wavelength-converted light that is emitted by the second light emitting elements 1a and wavelength-converted by the wavelength converting material contained in the second sealing member 5b.

Figure 2:
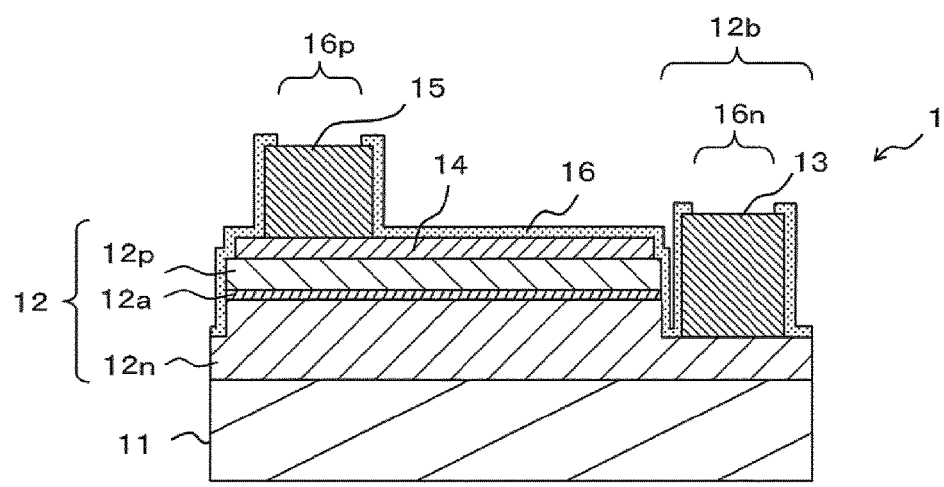
FIG. 2 is a schematic cross-sectional view illustrating a configuration of a light emitting device according to the first embodiment.

Example configurations of the first light emitting elements 1a and the second light emitting elements 1b will be described below with reference to FIG. 2. As described above, the first light emitting elements 1a and the second light emitting elements 1b may have different shapes and emission colors, but an overall configuration common to the first light emitting elements 1a and the second light emitting elements 1b will be described below illustrating the light emitting element 1 shown in FIG. 2.

The light emitting element 1 is an LED chip having a semiconductor layered body 12 in which an n-type semiconductor layer 12n, an active layer 12a, and a p-type semiconductor layer 12p are layered on a first main surface of a element substrate 11. The semiconductor stacked layer body 12 is configured to emit light upon applying electric current from an external power source electrically connected to an n-side electrode 13 and a p-side electrode 15.

The semiconductor layered body 12 has an exposed portion 12b that is a portion absent of the p-type semiconductor layer 12p and the active layer 12a, that is a portion of the n-type semiconductor layer 12n is exposed at the upper surface side of the semiconductor layered body 12. The exposed portion 12b is provided with an n-side electrode 13 that is electrically connected to the n-type semiconductor layer 12n. The exposed portion 12b is covered by the n-side electrode 13 and the insulating film 16, but for convenience of illustration, is referred to as the "exposed portion".

Further, a whole surface electrode 14 having good electrically conducting property and good light-transmissive property is disposed on an approximately entire surface of the upper surface of the p-type semiconductor layer 12p. Further, the p-side electrode 15 is disposed on a part of the whole surface electrode 14. Also, the surface at the semiconductor layered body 12 side is covered by the insulating film 16 except for the upper surfaces of the n-side electrode 13 and the p-side electrode 15. The openings 16n, 16p in the insulating film 16 at locations corresponding to the upper surfaces of the n-side electrode 13 and the p-side electrode 15 allow for connecting to the outside by wires 7 or the like.

For the n-type semiconductor layer 12 (an n-type semiconductor layer 12n, an active layer 12a, and a p-type semiconductor layer 12p), a nitride semiconductor such as $In_XAl_YGa_{1-X-Y}N$ ($0 \leq X$, $0 \leq Y$, $X+Y \leq 1$) can be suitably used. The electrode substrate 11, the n-side electrode 13, the whole surface electrode 14, the p-side electrode 15, the insulating film 16, and the semiconductor layered body 12 can respectively made of materials suitably employed in the art.

Mounting Substrate

The mounting substrate 2 is a substrate for mounting electronic components such as the first light emitting elements 1a and the second light emitting elements 1b, and includes a base member 21, a first wiring pattern 22, and a second wiring pattern 23 each disposed on an upper surface of the base member 21.

In the first embodiment, as shown in FIG. 1A and FIG. 1B, the mounting substrate 2 has a substantially rectangular plate-like shape, but any other appropriate shape can be used. For example, the mounting substrate 2 may have an outer shape in the shape of a circle or a polygon other than such a substantially rectangular shape.

For the base member 21, an insulating material is preferably used, which is also preferably a material that does not substantially transmit light emitted from the first light emitting elements 1a and the second light emitting elements 1b and outside light. Moreover, a material having a certain degree of strength is preferably used. Examples of such materials include ceramics such as $Al_2O_3$ and AlN, resins such as phenol resins, epoxy resins, polyimide resins, bis-maleimide-triazine (BT) resins, and polyphthalamide (PPA) resins. The upper surface of the base member 21 preferably has good light-reflecting properties at least regions where the first light emitting elements 1a and the second light emitting elements 1b to be mounted and for which a light-reflecting layer using a metal such as Ag or Al, or white resin containing a white pigment may be preferably provided.

In the first embodiment, the first wiring 22 serves as a positive electrode (anode) and has a pad portion 22a and wiring portion 22b to connect to the first light emitting elements 1a, the second light emitting elements 1b, and the protective element 6. The wiring portion 22b of the first embodiment branches from the pad portion 22a disposed in an upper left region in FIG. 1B and then extended in a semicircle along a left half portion of the first region 2a that is a ring-shaped arranging region of the first light emitting elements 1a. An anode mark AM may be provided near the pad portion 22a to identify the positive electrode (anode).

In the first embodiment, the second wiring 23 serves as a negative electrode (cathode) and has a pad portion 23a to connected to an external power source and a wiring portion 23b to connect to the first light emitting elements 1a, the second light emitting elements 1b, and the protective element 6. The wiring portion 23b of the first embodiment branches from the pad portion 23a disposed in a lower right region in FIG. 1B and then extended in a semicircle along a right half portion of the first region 2a.

In the first embodiment, the wiring portion 22b and the wiring portion 23b are respectively electrically connected to the first light emitting elements 1a by wires 7. Also, as shown in FIG. 1B, the protective element 6 may be mechanically and electrically connected to one end of the wiring portion 22b with the use of an electrically conductive adhesive such as a solder, and electrically connected to the wiring portion 23b with the use of a wire 7. For the first wiring 22 and the second wiring 23, for example, a metal film such as Cu, Au, Ag, or Al can be used. Other than the configuration shown in FIG. 1B, the first wiring 22 and the second wiring 23 may also be disposed appropriately according to the form of arrangement and electrical connection of the first light emitting elements 1a and the second light emitting elements 1b. The first wiring 22 and the second wiring 23 may be disposed so that the first light emitting elements 1a and the second light emitting elements 1b can be mounted in a flip-chip configuration.

First Frame

The first frame 3 surrounds the regions where the first light emitting elements 1a and the second light emitting elements 1b are arranged on the upper surface of the mounting substrate 2. In the first embodiment, as shown in FIG. 1B, the first frame 3 is disposed in a ring-shape with a width larger than the widths of the wiring portions 22b and 23b, so that the first frame 3 encloses the semicircular portion of the wiring 22b and the semicircular portion of the wiring 23b. The first frame 3 preferably has light shielding property, and is further preferably disposed so that the topmost portion of the first frame 3 is higher than the topmost portion of the first light emitting elements 1a.

In the case where the first frame 3 has light-reflecting property as the light-shielding property, compared to the case where the first frame 3 has light-absorbing property, light propagating in the sealing member 5 in a lateral direction from the first region 2a outward can be reflected to and extracted from the upper surface side of the sealing member 5, so that the light extraction efficiency of the light emitting device 100 can be enhanced. In the case where the first frame 3 has light-absorbing property as the light-shielding property, light propagating in the sealing member 5 in a lateral direction from the first region 2a outward can be absorbed to reduce extraction of light other than from the upper surface of the sealing member 5, which allows for obtaining of the light emitting device 100 having good visibility, i.e., high contrast in the luminance between the light emitting surface (light emitting region) and other regions (non light emitting region).

Examples of materials of the first frame 3 include resin materials having good light-transmissive property and good insulating property. More specifically, a thermosetting resin such as an epoxy resin or a silicone resin can be suitably used. Also, white resin can be obtained by dispersing particles of a light-reflecting material such as $TiO_2$, $Al_2O_3$, $ZrO_2$, or MgO in the resin material of the base member, and thus, the first frame 3 can be provide with light-reflecting property. Alternatively, black resin can be obtained by dispersing particles of light-absorbing material such as carbon black or graphite in the resin material of the base member, and thus, the first frame 3 can be provide with light-absorbing property.

Second Frame

As shown in FIG. 1B, the second frame 4 of the first embodiments is disposed in a ring shape on the upper surface of the mounting substrate 2, at a location between the first light emitting elements 1a and the second light emitting elements 1b to surround the second light emitting elements 1b. Thus, the second frame 4 is disposed spaced apart from the first frame 3. The uppermost portion of the second frame 4 is higher than the uppermost portion of the first frame 3. Also, an upper portion of the second frame 4 of the first embodiment is a light-transmissive portion having good light-transmissive property. Further, the second frame 4 of the first embodiment has a layered structure made of a first layer 41, a second layer 42, and a third layer 43.

The second frame 4 is preferably disposed concentrically to the ring-shaped first frame 3. Disposing the first region 2a that is one of the light emitting regions in a ring shape allows for isotropic light distribution.

In a case where the second frame body 4 includes multiple layers, the first layer 41 that is the lowermost layer preferably has light-shielding property which is preferably light-reflecting property. The highest portion of the first layer 41 is preferably higher than the highest portion of the first light emitting elements 1a and the second light emitting elements 1b.

With this arrangement, light emitted from lateral surfaces of the first light emitting elements 1a to the substantially horizontal direction and light emitted from lateral surfaces of the second light emitting elements 1b to the substantially horizontal direction can be prevented from propagating into the other's region. In the first region 2a and second region 2b, this restrains the light emitted in one of the regions from being subjected to wavelength conversion by the wavelength conversion material in the other region, facilitating managing a color tone of a luminescent color of the entire light emitting device 100. This can be particularly effective when the first sealing member 5a and the second sealing member 5b each contains a wavelength converting material to emit light of different colors from each other, at locations near the upper surfaces of the first light emitting elements 1a and the second light emitting elements 1b respectively. In the first region 2a and the second region 2b, light generated in one of the regions can be prevented from being wavelength converted by the wavelength converting material contained in the other region, which facilitates controlling of the emission color of the light emitting device 100 as a whole.

Further, in the first embodiment, the second layer 42 and the third layer 43, which are upper portions of the second frame 4, preferably have good light-transmissive property. Transparent layers are more preferable. Providing a light-transmissive portion with the second layer 42 and the third layer 43 which are upper portions, light propagating in the first sealing member 5a in the first region 2a and light propagating in the sealing member 5b in the second region 2b can propagate into the other regions each other. Thus, light originating from the first light emitting elements 1a and light originating from the second light emitting elements 1b can be favorably mixed in the entire sealing member 5.

The second frame 4 may have a single layer structure or a layered structure made of two layers or four or more layers. In the case where the second frame 4 has a layered structure, the first layer 41 may have light-transmissive property instead of light-shielding property. In the case where the second frame 4 has a single layer structure, the whole structure may have light-transmissive property.

For the materials of the second frame 4, the materials similar to those of the first frame 3 can be used. A light-transmissive portion (the second layer 42 and the third layer 43 in the first embodiment) having good light-reflecting property can be formed by using the resin materials as described above that does not contain a light-reflecting material or a light-absorbing material. The first frame 3 and the second frame 4 have a ring shape in plan view as described above, but a polygonal shape such as a rectangular shape or an oval shape may also be employed.

Sealing Member

In the first embodiment, the sealing member 5 includes a first sealing member 5a disposed in the first region 2a between the first frame 3 and the second frame 4, and a second sealing member 5b disposed in the second region 2b that is located inward of the second frame 4. The sealing member 5 seals the first light emitting elements 1a, the second light emitting elements 1b, and wires 7 disposed in the first region 2a and the second region 2b on the mounting substrate 2, to protect those components from dust, moisture, gases, external forces, or the like.

The sealing member 5 may contain particles of a wavelength converting material (fluorescent material) as needed. The wavelength converting materials of different emission colors may be respectively contained in the first region 2a and the second region 2b, or the wavelength converting material is contained in one of the first region 2a and the second region 2b. In the case where particles of the wavelength converting material are contained in the sealing member 5, the particles are preferably distributed in a bottom portion of the sealing member 5, that is, near the surfaces of the first light emitting elements 1a and/or the second light emitting element 1b. With this arrangement, the efficiency of wavelength conversion can be increased.

As described above, the emission color of the first light emitting elements 1a and the emission color of the second light emitting elements 1b may either be the same or different. Also, the emission color of the wavelength converting material contained in the first sealing member 5a and the emission color of the wavelength converting material contained in the second sealing member 5b may either be the same or different. Further, the wavelength converting material may be contained in either one of the first sealing member 5a and the second sealing member 5b. Various emission colors can be realized with the light emitting device 100 according to a combination of emission colors of those components.

In the first embodiment, the first sealing member 5a is disposed in the first region 2a, which is a peripheral region of the second region 2b, with a slanted upper surface which is outwardly lowered. Further, the sealing member 5b is disposed in the second region 2b, which is a center region, preferably in a convex shape as shown in FIG. 1C. Also, the lowest portion of the upper surface of the second sealing member 5b is higher than the highest portion of the upper surface of the first sealing member 5a. Thus, light originating from the first light emitting elements 1a and light originating from the second light emitting elements 1b can be efficiently mixed. The first sealing member 5a and the second sealing member 5b are disposed so that the light generates in the first sealing member 5a and the second sealing member 5b enters the light-transmissive portion of the second frame 4. For example, The first sealing member 5a and the second sealing member 5b are in contact with the light-transmissive portion of the second frame 4 respectively.

Making the upper surface of the first sealing member 5a inclined so that a portion thereof is higher as it is closer to the second region 2b, with the second frame 4 having a light transmissive property, allows the light emitted in the first region 2a to be directed toward the second region 2b directly or after being reflected on the upper surface of the first sealing member 5a. Further, the light emitted in the first region 2a and spreading upward in the first sealing member 5a can be refracted on the inclined surface as the upper surface of the first sealing member 5a. Accordingly, the light derived from the first light emitting elements 1a and second light emitting elements 1b can be mixed effectively. Thus, on a condition that the upper surface of the first sealing member 5a has a lower height with the increasing distance from the second frame 4 toward the first frame 3, and the upper surface of the second sealing member 5b is formed higher than the lowest portion of the upper surface of the first sealing member 5a, the upper surface of the second sealing member 5b may be formed in a concave shape or in a substantially flat shape, or the upper surface of the second sealing member 5b at the end thereof closer to the second frame 4 may be formed lower than the upper surface of the first sealing member 5a at the end thereof closer to the second frame 4.

Figure 1D:
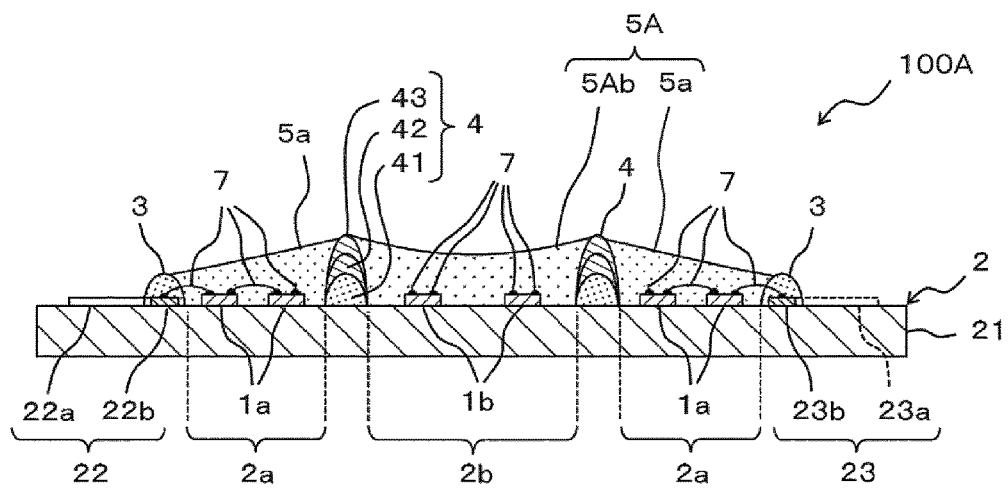
FIG. 1D is a schematic cross-sectional view illustrating a configuration of a light emitting device according to a modified example of the first embodiment.

FIG. 1D is a schematic cross-sectional view illustrating a configuration of a light emitting device 100A according to a modified example of the first embodiment. The light emitting device 100A has a sealing member 5A having a concave-shaped second member 5Ab. With the second sealing member 5Ab having concave-shaped upper surface, the light generate in the second region 2b may efficiently enter to the first region 2a by refracted at the upper surface of the second sealing member 5Ab. Thus, light originating from the first light emitting elements 1a and light originating from the second light emitting elements 1b can be efficiently mixed.

On a condition that the upper surface of the first sealing member 5a has a lower height with increasing distance from the second frame 4 toward the first frame 3, and the upper surfaces of the second sealing members 5b, 5Ab are formed higher than the lowest portion of the upper surface of the first sealing member 5a, the upper surfaces of the second sealing members 5b, 5Ab may be formed in a concave shape or in a convex shape. Also, the upper surfaces of the first sealing member 5a and the second sealing member 5b may be flat. In this case, the upper surface of the second sealing member 5b is higher than the upper surface of the first sealing member 5a.

It is preferable that the first sealing member 5a and the second sealing member 5b are respectively made of a material having a refractive index similar to that of the light-transmissive portion of the second frame 4, that is, in the first embodiment, the second layer 42 and the third layer 43. With the use of such materials, an optical interface will not be formed between the light-transmissive portion of the second frame 4 and the second sealing member 5b, so that a single light-guide member can be formed with the first sealing member 5a, the light-transmissive portion of the second frame 4, and the second sealing member 5b. The first sealing member 5a, the light-transmissive portion of the second frame 4, and the sealing member 5b are integrated to form a single light guide member, and thus, light propagating in the light guide member can be mixed efficiently. Further, the light guide member has a shape of a concave lens, so that light emitted from the upper surface of the light guide member can be condensed near the optical axis of the convex lens. Thus, color unevenness and/or luminance unevenness in the light emitted from the upper surface of the light guide member can be reduced and good light distributing properties can be obtained.

The first sealing member 5a and the second sealing member 5b of the first embodiment are separated by the second frame 4 as shown in FIG. 1C, but may be partially in contact with each other. That is, the first sealing member 5a and the second sealing member 5b may be continuously disposed.

The material of the sealing member 5 preferably has good light-transmissive property, good weather resistant property, and good light-resisting property. For example, a thermosetting resin such as a silicone resin, an epoxy resin, and a urea resin can be suitably used. A wavelength converting material that can absorb light from the first light emitting elements 1a in the first sealing member 5a and converts the wavelength of the light, and that can absorb light from the second light emitting elements 1b in the sealing member 5b and converts the wavelength of the light can be employed. The wavelength converting material contained in the sealing member 5 preferably has a specific gravity greater than that of the resin material used for the sealing member 5. With the use of the wavelength converting material having a specific gravity greater than that of the resin material, particles of the wavelength converting material can be precipitated in the sealing member 5 in manufacturing, so that the wavelength converting material can be disposed near the surfaces of the first light emitting elements 1a and the second light emitting elements 1b.

Specific examples of the wavelength converting material include a yellow fluorescent material such as YAG ($Y_3Al_5O_{12}$:Ce) and silicate, and a red fluorescent material such as CASN (CaAlSiN$_3$:Eu) and KSF (K$_2$SiF$_6$:Mn). The sealing member 5 may further contain a filler material. For such a filler material, for example, particles of $SiO_2$, $TiO_2$, $Al_2O_3$, $ZrO_2$, MgO or the like can be suitably used. Further, for the purpose of cutting light of undesired wavelengths, for example, an organic or inorganic coloring dye or coloring pigment may be contained in the sealing member 5.

Protective Element

A protective element 6 is provided in the aim of protecting the first light emitting elements 1a and the second light emitting elements 1b from electrostatic discharge or the like. For the protective element 6, for example, a Zener diode, a varistor, a resistor, a capacitor, or the like, can be used. The protective element may be optionally provided.

Wire

A wire 7 is a wiring member used to electrically connect between the first light emitting elements 1a and the second light emitting elements 1b, between the first light emitting elements 1a and the wiring portion 22b and the wiring portion 23b. The wire 7 may be used to electrically connect between the protective element 6 and the wiring portion 23b. For the wire 7, a metal wire made of a metal such as Cu, Au, Ag, or Al having good electric conductivity, or an alloy whose main component is one or more of those metals can be suitably used.

The arrangement of the first light emitting elements 1a and the second light emitting elements 1b, that is, the first region 2a and the second region 2b, may be a circular formation or may be another formation such as an elliptic formation, an oblong-oval formation, or a polygonal formation such as a quadrangular formation and a hexagonal formation. Regardless of the respective formations, such as elliptical, oblong-oval, or polygonal, the first region 2a and the second region 2b are preferably arranged so that the centers of the regions overlap.

Operation of Light Emitting Device

Figure 3:
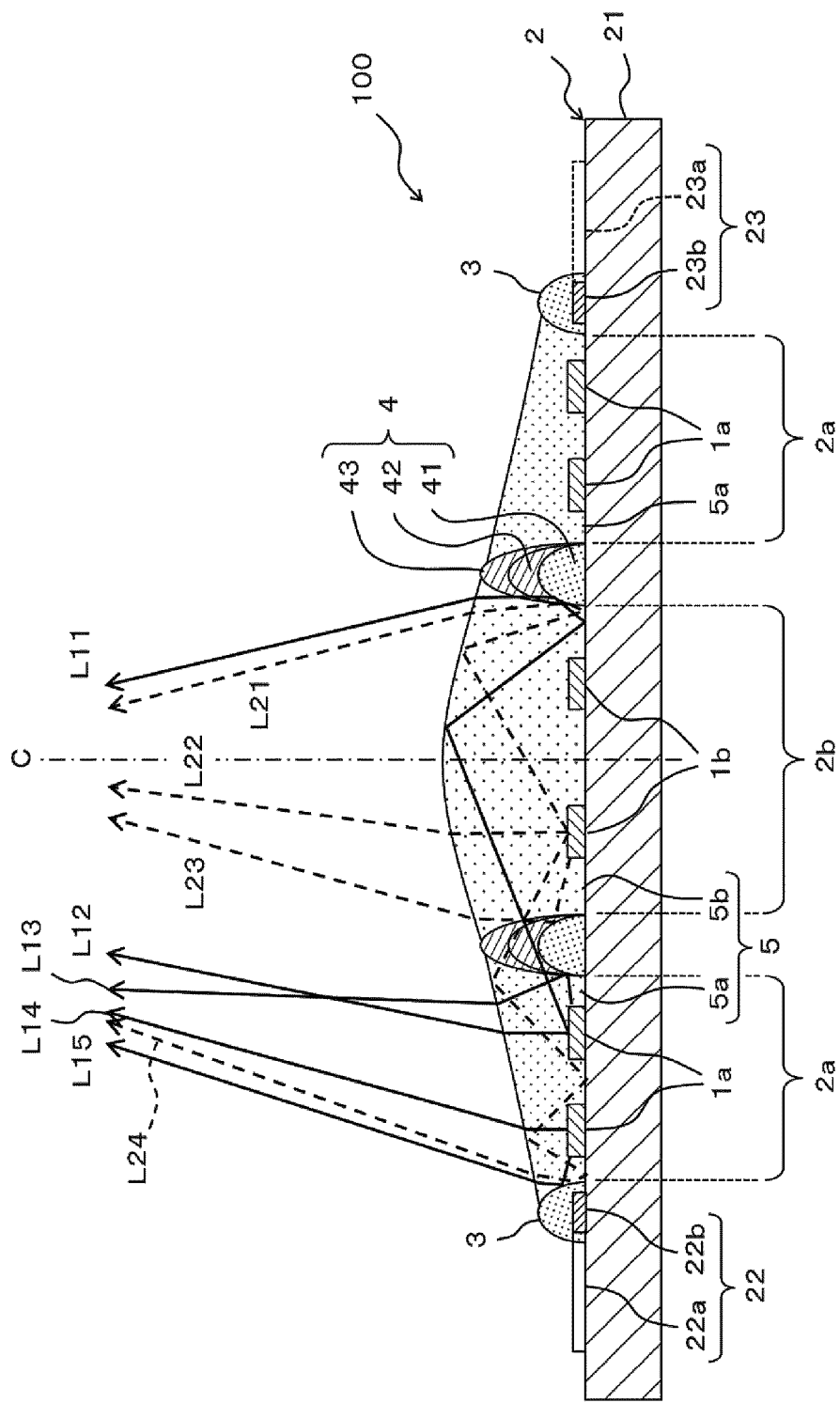
FIG. 3 is a schematic cross-sectional view illustrating extracting of light in a light emitting device according to the first embodiment.

Next, operation of the light emitting device 100 according to the first embodiment will be described with reference to FIG. 3. In FIG. 3, light L11 to L15 originating from the first light emitting elements 1a is shown by solid lines and light L21 to L24 originating from the second light emitting elements 1b is shown by dotted lines. Also, in the schematic cross-sectional view shown in FIG. 3, the first light emitting elements 1a, the second light emitting elements 1b, the first frame 3, the second frame 4, the first sealing member 5a and the second sealing member 5b are arranged substantially symmetrically relative to the optical axis C of the sealing member. Accordingly, only the typical light paths of light originating from the first light emitting elements 1a and the second light emitting elements 1b arranged in the left half part region are schematically illustrated in FIG. 3.

The optical axis C of the convex lens formed by the sealing member 5 and the light-transmissive portion of the second frame 4 is aligned to the center axis of the region where the components described above are arranged. The first frame 3 and the first layer 41 that is the lowermost layer of the second frame 4 are light-reflective and the second layer 42 and the third layer 43 that are upper layers of the second frame 4 are transparent. Also, materials of the first sealing member 5a, the second sealing member 5b, the second layer 42 and the third layer 43 of the second frame 4 have substantially the same refractive index.

An external power source is connected to the pad portion 22a of the first wiring 22 and the pad portion 23a of the second wiring 23 of the mounting substrate 2. Thus, electric power can be supplied to each of the first light emitting elements 1a and the second light emitting elements 1b through the wiring portions 22b, 23b and the wires 7, to cause emission.

In the light emitting device 100 according to the first embodiment, light emitted by the first light emitting elements 1a propagates in the first sealing member 5a with the initial wavelength or with a converted wavelength by the wavelength converting material in the first sealing member 5a. The lights L12, L14 propagating upward in the first sealing member 5a are refracted at the upper surface of the first sealing member 5a toward the optical axis C and extracted to the outside.

In the light emitting device 100 according to the first embodiment, the light L11 originating from the first light emitting elements 1a and propagating slightly upward toward the second region 2b passes through the transparent second layer 42 or the transparent third layer 43 of the second frame 4. When the light L11 enters an interface with an outside air, which is the upper surface of the second sealing member 5b, at an incident angle greater than or equal to a critical angle of total reflection, the light L11 is reflected totally on the interface. The light L11 is further reflected on the upper surface of the base member 21 and the first layer 41 having light reflectivity of the second frame 4 to spread toward the upper surface of the second sealing member 5b. The light L11 is refracted at the upper surface of the second sealing member 5b toward the optical axis C and extracted to the outside.

In the light emitting device 100 according to the first embodiment, light L13 originating from the first light emitting elements 1a and propagating approximately in parallel to an upper surface of the mounting substrate 2 toward the second region 2b is reflected by a light-reflective first layer 41 of the second frame 4, and refracted at the upper surface of the first sealing member 5a toward the optical axis C and extracted to the outside.

In the light emitting device 100 according to the first embodiment, the light L15 originating from the first light emitting elements 1a and propagating outward in the first region 2a at an angle approximately in parallel to the upper surface of the mounting substrate 2 is reflected by the first frame 3 and refracted toward the optical axis C at the upper surface of the first sealing member 5a and extracted to the outside.

In the light emitting device 100 according to the first embodiment, light emitted by the second light emitting elements 1b propagates in the second sealing member 5b with the initial wavelength or with a converted wavelength by the wavelength converting material in the second sealing member 5b. The lights L22 propagating upward in the second sealing member 5b are refracted at the upper surface of the second sealing member 5b toward the optical axis C of the convex lens due to condensation of light by the convex lens, and extracted to the outside. Further, the light L21 spreading diagonally upward in the second sealing member 5b enters the interface with an outside air, which is the upper surface of the second sealing member 5b, at an incident angle greater than or equal to a critical angle of total reflection, the light L21 is reflected totally on the interface. The light L21 is further reflected on the upper surface of the base member 21 and the first layer 41 of the second frame 4 to spread toward the upper surface of the second sealing member 5b. The light L21 is refracted at the upper surface of the second sealing member 5b toward the optical axis C of the convex lens due to condensation of light by the convex lens, and extracted to the outside.

In the light emitting device 100 according to the first embodiment, the light L24 originating from the second light emitting elements 1b and propagating slightly upward toward the first region 2a passes through the transparent second layer 42 or the transparent third layer 43 of the second frame 4, and further propagate in the first sealing member 5a. Further, the light L24 spreads while being repetitively reflected on the upper surface of the first sealing member 5a and the upper surface of the base member 21, to be further reflected by the first frame 3 for spreading toward the upper surface of the first sealing member 5a. The light L24 is refracted at the upper surface of the second sealing member 5a toward the optical axis C and extracted to the outside.

In the light emitting device 100 according to the first embodiment, the light L23 originating from the second light emitting elements 1b and propagating approximately in parallel to an upper surface of the mounting substrate 2 toward the first region 2a is reflected by the light-reflective first layer 41 of the second frame 4, and refracted at the upper surface of the second sealing member 5b toward the optical axis C and extracted to the outside.

In the light emitting device 100 according to the first embodiment, as described above, light originating from the first light emitting elements 1a and light originating from the second light emitting elements 1b are efficiently mixed in the light guide member integrally formed by the first sealing member 5a, the light-transmissive portion of the second frame 4, and the second sealing member 5b.

Further, the light guide member is formed in a convex lens shape that allows condensing of light toward the optical axis C. Thus, light emitted from the upper surface of the light guide member can be efficiently mixed in and near the optical axis direction. Thus, unevenness in the color and in the luminance is reduced and good light emitting device can be obtained in the light emitted from the light emitting device 100.

In the case where either one or both the first sealing member 5a and the second sealing member 5b contains a wavelength converting material, and the wavelength converting material is distributed near the surfaces of the first light emitting elements 1a or the second light emitting elements 1b in the region of corresponding sealing member, the light originating from the first light emitting elements 1a and the light originating from the second light emitting elements 1b are shielded by the first layer 41 of the second frame 4, so that light originating from each region can be prevented from being wavelength converted by the wavelength converting material contained in the other region. Accordingly, color mixing of the light emitted by the first light emitting elements 1a, the light emitted by the wavelength converting material in the first sealing member 5a, the light emitted by the second light emitting elements 1b, and the light emitted by the wavelength converting material in the second sealing member 5b at a desired ratio can be facilitated.

Further, in the case where the emission color of the first light emitting elements 1a and the emission color of the second light emitting elements 1b are the same, and/or the emission color of the wavelength converting material contained in the first sealing member 5a and the emission color of the wavelength converting material contained in the second sealing member 5b are the same, unevenness due to a difference in brightness or a minute difference in color among the individual light emitting elements, and unevenness due to a distribution of the wavelength converting material or the like can be reduced.

Method of Manufacturing Light Emitting Device

Figure 4:
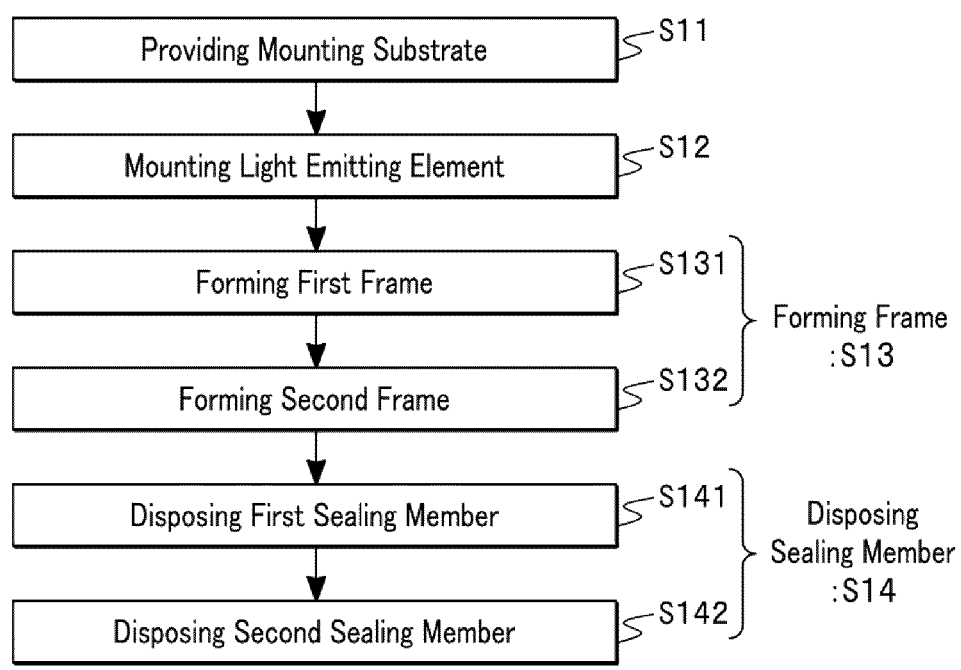
FIG. 4 is a flow chart showing a procedure of a method of manufacturing a light emitting device according to the first embodiment.

Next, a method of manufacturing the light emitting device according to the first embodiment will be described with reference to FIG. 4 to FIG. 5F. The method of manufacturing the light emitting device according the first embodiment includes, as shown in FIG. 4, providing a mounting substrate (S11), mounting a light emitting element (S12), forming a frame (S13), and disposing a sealing member (S14).

The step of forming a frame (S13) includes forming a first frame (S131) and forming a second frame (S132). Also, in the method of manufacturing the light emitting device according the first embodiment, the step of disposing a sealing member (S14) includes disposing a first sealing member (S141) and disposing a second sealing member (S142).

Figure 5A:
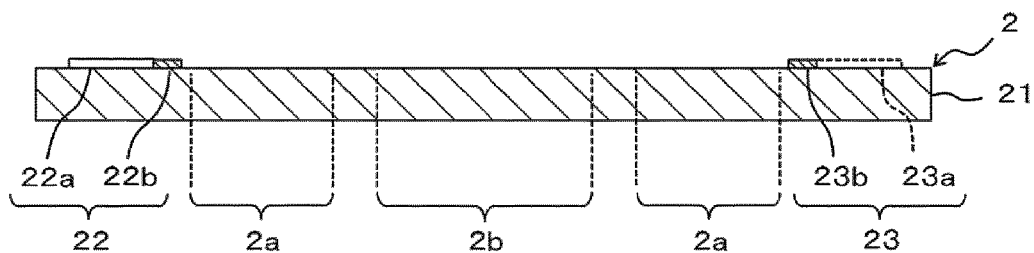
FIG. 5A is a schematic cross-sectional view illustrating providing a substrate in a method of manufacturing a light emitting device according to the first embodiment.

In the step of providing a mounting substrate (S11), as shown in FIG. 5A, a mounting substrate 2 having an electrically insulating base member 21 and a first wiring 22 and a second wiring 23 disposed on an upper surface of the base member 21 is provided. Those wiring patterns can be formed, for example, by using a subtracting method, in which a metal film is disposed on the entire upper surface of the base member 21, a mask is disposed on the metal film so as to cover a region to be left on the metal film as the wiring patterns, and uncovered portion of the metal film is etched.

In the present specification, a step of "providing" refers also to obtaining a commercially available mounting substrate 2 as well as to manufacturing a mounting substrate 2 by using a method such as described above.

Figure 5B:
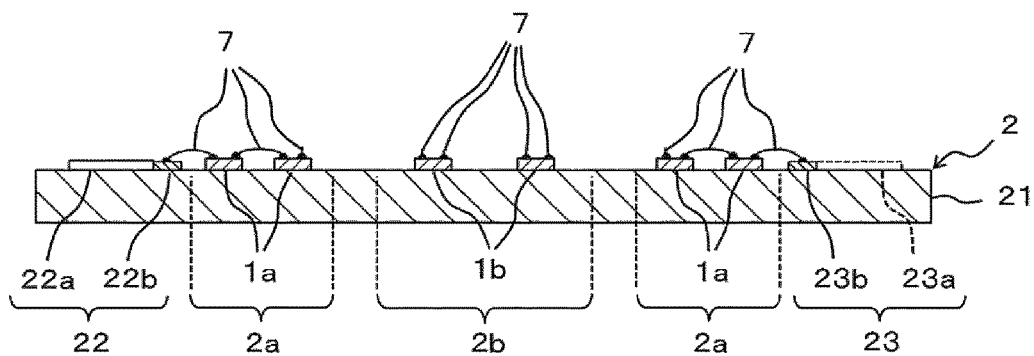
FIG. 5B is a schematic cross-sectional view illustrating mounting light emitting elements in a method of manufacturing a light emitting device according to the first embodiment.

In the step of mounting a light emitting element (step of mounting the first light emitting elements and the second light emitting elements) (S12), as shown in FIG. 5B, the first light emitting elements 1a and the second light emitting elements 1b are mounted on the mounting substrate 2. In this step, the first light emitting elements 1a and the second light emitting elements 1b are respectively bonded on the predetermined positions of the upper surface of the mounting substrate 2 by using a bonding member such as a solder and a die-bonding resin.

After bonding all the first light emitting elements 1a and the second light emitting elements 1b to the mounting substrate 2, in the method of manufacturing of the first embodiment, with the use of wires 7, the first light emitting elements 1a and the second light emitting elements 1b, the first light emitting elements 1a and the wiring portion 22b of the first wiring 22, and the first light emitting elements 1a and the wiring portion 23b of the second wiring portion 23 are respectively electrically connected.

In this step, a protective element 6 can also be mounted on the mounting substrate 2.

The step of forming a frame (S13) includes a step of forming a first frame (S131) to form the first frame 3 and a step of forming a second frame (S132) to form the second frame 4. The first frame 3 and the second frame 4 are preferably formed using thermosetting resin. With the use of thermosetting resin, a frame of a desired shape can be formed easily without a need of a mold. Next, a method of forming the first frame 3 and the second frame 4 with the use of thermosetting resin will be described.

Figure 5C:
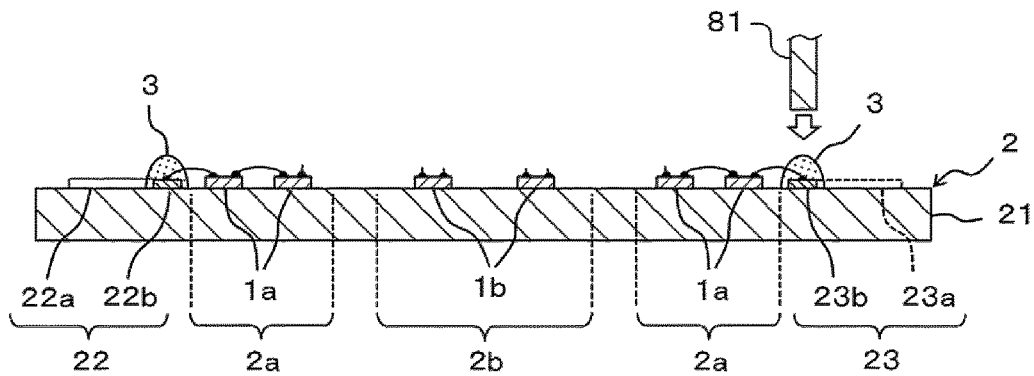
FIG. 5C is a schematic cross-sectional view illustrating forming a first frame in a method of manufacturing a light emitting device according to the first embodiment.

In the step of forming the first frame (S131), as shown in FIG. 5C, the first frame 3 is formed. Using a dispenser 81, a liquid resin material that preferably contains a light-shielding material is disposed to surround all the first light emitting elements 1a and the second light emitting elements 1b. The viscosity of the liquid resin material is adjusted so that the uppermost portion of the first frame 3 is higher than the uppermost portion of the first light emitting elements 1a. Then, a heat treatment is carried out to cure the resin material to form the first frame 3.

The viscosity of the liquid resin material can be adjusted by the amount of solvent and the amount of the filler that is optionally added. A similar method can also be used to adjust the viscosity of the corresponding liquid resin material, in forming the second frame 4, disposing the first sealing member 5a and the second sealing member 5b to be described below.

Figure 5D:
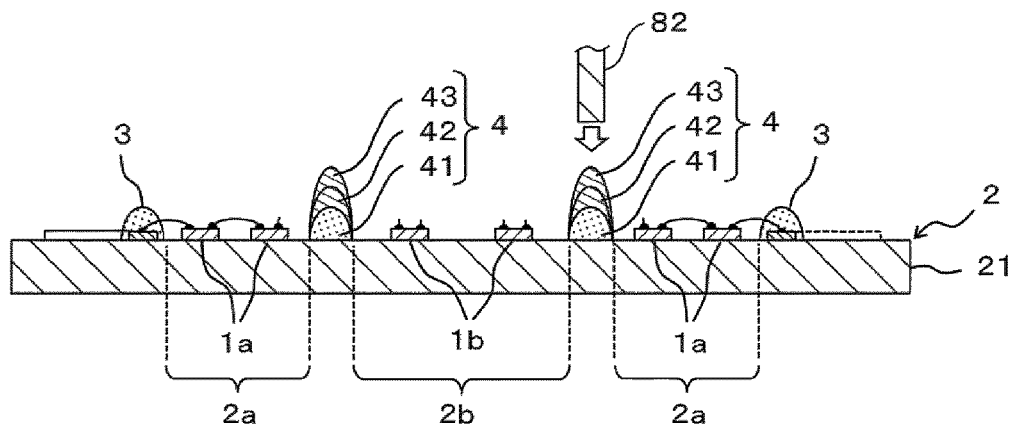
FIG. 5D is a schematic cross-sectional view illustrating forming a second frame in a method of manufacturing a light emitting device according to the first embodiment.

Next, in the forming a second frame (S132), the second frame 4 is formed as shown in FIG. 5D. According to the method of the first embodiment, the first layer 41, the second layer 42, and the third layer 43 are layered in this order to form the second frame 4. Using a dispenser 82, a liquid resin material that preferably contains a light-shielding material is disposed between the first light emitting elements 1a and the second light emitting elements 1b. Then, a heat treatment is carried out to cure the resin material to form the first layer 41.

Next, using the dispenser 82, a light-transmissive liquid resin material is supplied on the first layer 41 and a heat treatment is carried out to form the second layer 42. Using the resin material as in the second layer 42, in a similar manner, the third layer 43 is formed on the second layer 42 to form a light-transmissive portion.

The heat treatment applied on the first layer 41, the second layer 42, and the third layer 43 may be carried out under conditions to pre-cure the thermosetting resin and after the third layer 43 is layered, another heat treatment may be carried out under conditions to complete the curing of the thermosetting resin. With this, the first layer 41, the second layer 42, and the third layer 43 can be joined firmly.

With the use of the liquid resin material having higher viscosity for the second frame 4 than that of the liquid resin material for the first frame 3, the second frame 4 can be formed with a single layer configuration and higher than the first frame 3.

Either the step of forming the first frame (S131) or the step of forming the second frame (S132) can be performed first, but the first frame 3, which has a height smaller than the second frame 4, is preferably formed first. In the case of forming the second frame 4 having a greater height than the first frame 3 before forming the first frame 3, the nozzle of the dispenser 81 may contact with the nozzle of the dispenser 82 at the time of movement of the nozzle. Such a failure can be avoided by performing the step of forming the first frame (S131) first.

Also, the first frame 3 and the first layer 41 of the second frame 4 may be formed at the same time with the use of a same material that contains a light shielding material. Then, the second layer 42 and the third layer 43 (light-transmissive portion) of the second frame 4 may be formed.

In the method of manufacturing according to the first embodiment, the step of disposing a sealing member (a step of filling a sealing member) (S14) includes a step of disposing a first sealing member 5a (S141) and a step of disposing a second sealing member 5b (S142). The first sealing member 5a and the second sealing member 5b are formed in a convex-lens shape as an integrated shape of the sealing member 5, and for which, thermosetting resin is preferably used. With the use of thermosetting resin, the sealing member 5 of a convex-lens shape can be easily formed, without using a mold or without performing a latter step such as grinding.

Next, a method of forming the first sealing member 5a and the second sealing member 5b with the use of thermosetting resin will be described.

Figure 5E:
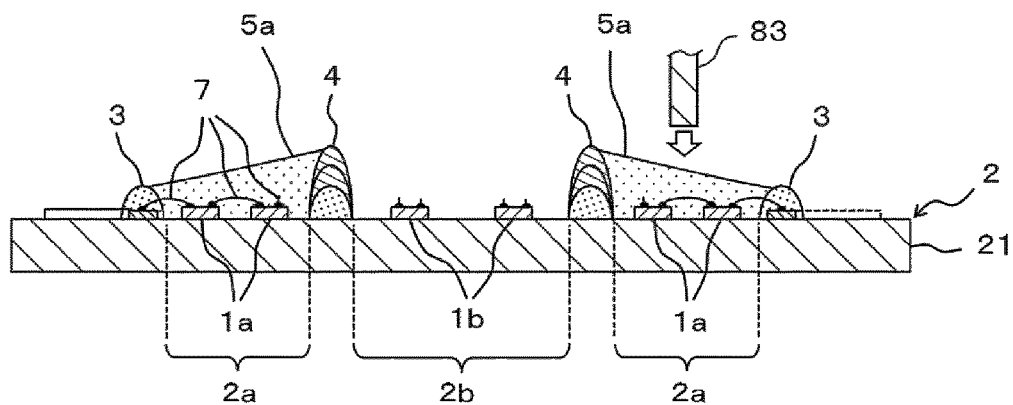
FIG. 5E is a schematic cross-sectional view illustrating disposing a first sealing member in a method of manufacturing a light emitting device according to the first embodiment.

In a method according to the first embodiment, first, in the step of forming a first sealing member (S141), as shown in FIG. 5E, a first sealing member 5a is formed in a first region 2a between a first frame 3 and the second frame 4 so as to seal the first light emitting elements 1a and a wire 7 provided in the first region 2a.

In this step, using a dispenser 83, liquid resin material is filled in the first region 2a. The liquid resin material may contain particles of a wavelength converting material as needed, and is adjusted to have an appropriate viscosity. In this step, the term "appropriate viscosity" refers to a viscosity that allows formation of a gentle slope from near a highest portion of the second frame 4 to near a highest portion of the first frame 3, reducing the height outward. An appropriate viscosity can be determined according to a distance between the first frame 3 and the second frame 4.

After disposing the liquid resin material, in the case of including particles of wavelength converting material, preferably after sedimentation of the particles, a heat treatment is carried out to cure the resin material. Thus, the first sealing member 5a is formed.

Figure 5F:
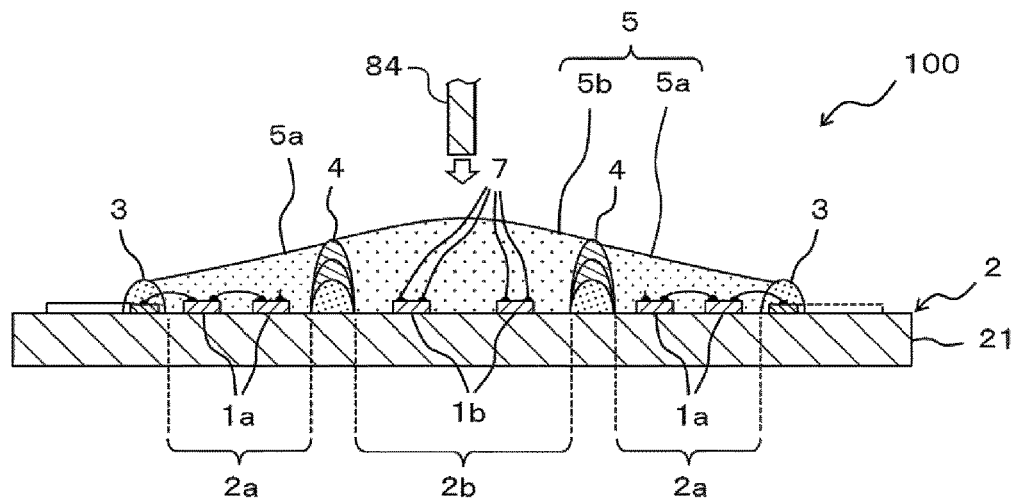
FIG. 5F is a schematic cross-sectional view illustrating disposing a second sealing member in a method of manufacturing a light emitting device according to the first embodiment.

Next, in the step of disposing a second sealing member (S142), as shown in FIG. 5F, a second sealing member 5b is disposed in the second region 2b that is a region inward of the second frame 4, to seal the second light emitting elements 1b and wires provided in the second region 2b.

In this step, first, with the use of the dispenser 84, a liquid resin material is disposed in the second region 2b. The liquid resin material may contain particles of a wavelength converting material as needed, and is adjusted to have an appropriate viscosity. The term "appropriate viscosity" refers to a viscosity that allows the upper surface of the sealing member in the second region 2b is higher than the lowest portion on the upper surface of the sealing member 5 in the first region 2a and the sealing member 5 can be formed in a convex shape as the entire sealing member 5, combined with the shape of the first sealing member 5a. In the present embodiment, the term "appropriate viscosity" refers to a viscosity that allows formation of a convex-shape with a bulging center portion in the second region 2b. After forming the convex-lens shape, disposing the liquid resin material, in the case of including particles of wavelength converting material, preferably after sedimentation of the particles, a heat treatment is carried out to cure the resin material. Thus, the second sealing member 5b is formed.

Either the step of disposing the first sealing member (S141) or the step of forming the second sealing member (S142) can be performed first.

Alternatively, in the step of forming the first frame (S131), in the step of forming the second frame (S132), in the step of disposing the first sealing member (S141), and the step of disposing the second sealing member (S142), the thermosetting resin that form the first frame 3, the second frame 4, the first sealing member 5a, and the second sealing member 5b is pre-cured in each step, and after disposing all the members, heat treatment is performed to complete the curing of the thermosetting resin. This way, the first layer 41, the second layer 42, and the third layer 43 can be joined firmly.

With the steps as described above, the light emitting device 100 can be manufactured.

As shown above, a semiconductor light emitting element and a method of manufacturing the semiconductor light emitting element are illustrated in accordance with embodiments for carrying out the present invention, but the scope of the invention is not limited to the above description, and should be widely understood based on the scope of the claims. Further, based on the above description, it will be obvious that various changes and modifications can be made therein without departing from the scope of the invention.

The light emitting device according to the present disclosure is applicable for various light sources, for example, various lighting devices such as LED lighting bulbs and LED spotlights, backlight light sources of liquid crystal displays, large-screen displays, various display devices for advertisement, destination guide, or the like, and furthermore, image reading devices in digital video cameras, facsimiles, copiers, and scanners, and projectors or the like.

Some embodiments according to the present invention have been described above, but the present invention is not limited by those embodiments, and any appropriate embodiments within the gist of the invention can be included.

What is claimed is:

1. A light emitting device comprising:
    a substrate;
    a first frame located on the substrate;
    a second frame located on the substrate, the second frame being located inward of and spaced apart from the first frame;
    at least one first light emitting element located on the substrate in a first region located between the first frame and the second frame;
    at least one second light emitting element located on the substrate in a second region located inward of the second frame; and
    a sealing member covering the at least one first light emitting element and the at least one second light emitting element;
    wherein the second frame includes a light-transmissive portion;
    wherein a highest portion of the second frame is higher than a highest portion of the first frame;
    wherein an upper surface of a portion of the sealing member in the first region is formed such that a portion closer to the first frame is lower than a portion closer to the second frame; and
    wherein an upper surface of a portion of the sealing member in the second region is formed higher than the lowest portion of the upper surface of the sealing member in the first region.

2. The light emitting device according to claim 1, wherein the portion of the sealing member in the second region has a convex shape.

3. The light emitting device according to claim 1, wherein the portion of the sealing member in the second region has a concave shape.

4. The light emitting device according to claim 1, wherein the sealing member has curved upper surfaces.

5. The light emitting device according to claim 1, wherein a height of the portion of the sealing member in the first region increases from the first frame side to the second frame side.

6. The light emitting device according to claim 1, wherein the second frame has a layered structure.

7. The light emitting device according to claim 6, wherein a lowermost layer of the layered structure of the second frame has a light shielding property.

8. The light emitting device according to claim 1, wherein an emission color of the at least one first light emitting element differs from an emission color of the at least one second light emitting element.

9. The light emitting device according to claim 1, wherein the sealing member includes a first sealing member disposed in the first region and a second sealing member disposed in the second region.

10. The light emitting device according to claim 9, wherein the first sealing member and the second sealing member contain different wavelength converting materials.

11. The light emitting device according to claim 9, wherein the first sealing member or the second sealing member contains a wavelength converting material.

12. The light emitting device according to claim 1, wherein the first frame has a light shielding property.

13. The light emitting device according to claim 1, wherein the highest portion of the first frame is higher than a highest portion of the at least one first light emitting element.

14. The light emitting device according to claim 1, wherein the first frame and the second frame are substantially concentric.

15. A method of manufacturing a light emitting device comprising:
    mounting at least one first light emitting element on a first portion of a substrate and at least one second light emitting element on a second portion of the substrate;
    forming a first frame on the substrate such that the first frame surrounds the at least one first light emitting element and the at least one second light emitting element;
    forming a second frame on the substrate such that the second frame is between the at least one light emitting element and the at least one second light emitting element, and such that the second frame surrounds the at least one second light emitting element; and
    disposing a sealing member such that a portion of the sealing member is in a first region between the first frame and the second frame and a portion of the sealing member is in a second region surrounded by the second region, the sealing member covering the at least one light emitting element and the at least one second light emitting element;
    wherein the first frame and the second frame are formed spaced apart from each other; and
    wherein a highest portion of the second frame is formed higher than a highest portion of the first frame.

16. The method according to claim 15, wherein the first frame is formed before forming the second frame.

17. The method according to claim 15, wherein the second frame is formed by layering a plurality of layers.

* * * * *